United States Patent
Sivero et al.

(10) Patent No.: US 7,333,389 B2
(45) Date of Patent: Feb. 19, 2008

(54) COLUMN DECODING ARCHITECTURE FOR FLASH MEMORIES

(75) Inventors: Stefano Sivero, Vergiate (IT); Simone Bartoli, Cambiago (IT); Fabio Tassan Caser, Arcore Milan (IT); Riccardo Riva Reggiori, Segrate (IT)

(73) Assignee: Atmel Corporation, San Jose, CA (US)

( * ) Notice: Subject to any disclaimer, the term of this patent is extended or adjusted under 35 U.S.C. 154(b) by 85 days.

(21) Appl. No.: 11/126,441

(22) Filed: May 11, 2005

(65) Prior Publication Data

US 2006/0077746 A1 Apr. 13, 2006

(30) Foreign Application Priority Data

Oct. 8, 2004 (IT) .......................... MI2004A1910

(51) Int. Cl.
*G11C 8/00* (2006.01)
(52) U.S. Cl. ................................. 365/230.06
(58) Field of Classification Search .......... 365/230.06, 365/189.05, 236, 238.5, 239, 233, 230.02; 711/105, 104

See application file for complete search history.

(56) References Cited

U.S. PATENT DOCUMENTS

| 4,567,581 | A | 1/1986 | Dumbri et al. |
| 5,289,413 | A | 2/1994 | Tsuchida et al. |
| 5,777,943 | A | 7/1998 | Kim et al. |
| 5,835,446 | A | 11/1998 | Park |
| 5,867,433 | A | 2/1999 | Shen et al. |
| 5,903,496 | A * | 5/1999 | Kendall et al. ........ 365/185.12 |
| 6,128,247 | A | 10/2000 | Koshikawa |
| 6,275,202 | B1 | 8/2001 | Campbell |
| 6,425,062 | B1 * | 7/2002 | Kendall et al. ............. 711/167 |
| 6,507,534 | B2 | 1/2003 | Balluchi |
| 6,600,342 | B1 | 7/2003 | Lee et al. |
| 6,791,898 | B1 * | 9/2004 | Manapat et al. ............ 365/233 |
| 2002/0085417 | A1 * | 7/2002 | Pekny et al. ........... 365/185.11 |
| 2006/0077746 | A1 * | 4/2006 | Sivero et al. .......... 365/230.06 |

* cited by examiner

*Primary Examiner*—Van Thu Nguyen
*Assistant Examiner*—Douglas S. King
(74) *Attorney, Agent, or Firm*—Sawyer Law Group LLP

(57) ABSTRACT

An improved method and device for column decoding for flash memory devices utilizes a burst page with a length greater than the length of a logical page. When a misalignment of an initial address occurs, valid reads across logical page boundaries are possible. The memory device enters the wait state only when a read crosses a burst page boundary. This minimizes the amount of time in which the memory device enters the wait state. In the preferred embodiment, this is achieved with a different management of the control signals that feed the third level of a three-level decoding stage column decoder. Changes to the architecture or in the number of column decoder selectors are not required. The memory access time during synchronous reads is thus improved.

15 Claims, 6 Drawing Sheets

COLUMN DECODING ARCHITECTURE FOR FLASH MEMORIES

CROSS-REFERENCE TO RELATED APPLICATIONS

This application claims benefit under 35 USC 119 of Italian Application no. MI2004A 001910, filed on Oct. 8, 2004.

FIELD OF THE INVENTION

The present invention relates to flash memory devices, and more particularly to the column decoder of flash memory devices.

BACKGROUND OF THE INVENTION

An asynchronous flash memory with a page mode read feature reads out a page of four words at every memory access. When configured in synchronous mode, the memory device must perform sequential reads starting from an initial address. Four words at once are always read. In the existing state of the art, several column decoder architectures have been proposed to implement the above mentioned reading parallelism.

FIG. 1 illustrates a conventional column decoder for a single bit of a word. Here, four words are simultaneously read by means of four sense amplifiers (SA) 102. Each SA 102 is connected through three levels of decoding stages 103-105 to 128 bit lines (BL). The selector multiplexer 101 is used to actively choose one word among the four reads. The signals that control the three levels of decoding stages 103-105 are common for all the bits of the four words, and each group of four words (a logical page) has its own selector multiplexer 101. The resulting total number of selector multiplexers is equal to the bit length of a read word, that in turn is equal to the number of outputs.

For example, suppose that the subdivision of the column decoding control bits and selector multiplexer control bits is as follows:

2 address bits used to choose one word among the four reads: ADD<1:0>. This choice follows directly from the memory device's specifications, which demands a scrolling of the read page in asynchronous mode by commuting the two less significant bits of the address.

7 address bits used to address the 128 cells (bits) in the matrix array: ADD<8:2>

As illustrated in FIG. 2, assume that these 7 bits are used to implement the three levels of column decoding states 103-105 in the following way:

ADD<8:6> decode 8 independent signals (YD)
ADD<5:4> decode 4 independent signals (YN)
ADD<3:2> decode 4 independent signals (YM)

The architecture of the column decoder is hence the following:

The local BL selectors YD sel<7:0> form the first level 105 of the column decoder. These selectors connect the drains of the array cells (local BLs) to the global BLs running all over the device. Each sector has its own set of YD sel<7:0> and its own local BLs. Each of the 16 global BLs is connected via YD sel<7:0> gated by the eight YD<7:0> signals) to eight cells in the array, for a total of 128 bits per output.

The 16 global BLs enter the second level of column decoder stage 104, which includes four groups of selectors, each group being made of four YN sel<3:0> selectors. They are gated by the four YN<3:0> signals. The four global BLs of each group are connected via YN sel<3:0> to a main BL, for a total of four main BLs, each connected to a group of four global BL.

The four main BLs enter the third level of column decoder stage 103, which includes a group of four selectors YM sel<3:0>, gated by YM<3:0> signals. These selectors connect in turn one of the four main BLs to the sense BL that feeds the sense circuitry.

However, this architecture has a significant limitation in performing reads of groups of consecutive words starting from a word whose initial address is not a multiple of four, or, is "misaligned" to a 4-word boundary. In this case, the read implies what is called a logical page boundary crossing. In this specification, a 4-word boundary will be referred to as a "logical page boundary", and 4 words whose addresses only differ for ADD<4:0> will be referred to as words belonging to the same logical page. Only the words within the logical page addressed by the first word to be read are valid. The memory device then enters a "wait state", during which invalid data are supplied to the output, negatively impacting the performance of the column decoder. The possibility of having wait states occurs in burst mode reading, when consecutive words must be read out from the matrix array starting from an arbitrary address. Some types of burst reads actually imply a logical page boundary crossing.

Accordingly, there exists a need for an improved method and device for column decoding for flash memory devices. The improved method and device should minimize the need for the memory device to enter the wait state when a misalignment of the initial address of a read occurs. The present invention addresses such a need.

SUMMARY OF THE INVENTION

An improved method and device for column decoding for flash memory devices utilizes a burst page with a length greater than the length of a logical page. When a misalignment of an initial address occurs, valid reads across logical page boundaries are possible. The memory device enters the wait state only when a read crosses a burst page boundary. This minimizes the amount of time in which the memory device enters the wait state. In the preferred embodiment, this is achieved with a different management of the control signals that feed the third level of a three-level decoding stage column decoder. Changes to the architecture or in the number of column decoder selectors are not required. The memory access time during synchronous reads is thus improved.

DETAILED DESCRIPTION

The present invention provides an improved method and device for column decoding for flash memory devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To achieve the desired performances, the logical page should be somehow "enlarged". In this specification, the enlarged logical page will be referred to as a "burst page" and the enlarged logical boundary will be referred to as a "burst page boundary". The present invention thus utilizes a burst page with a length greater than the length of a logical page. When a misalignment with respect to a logical page boundary of an initial address occurs, valid reads across logical page boundaries are possible. The memory device enters the wait state only when a read crosses a burst page boundary. This minimizes the amount in which the memory device enters the wait state. In the preferred embodiment, this is achieved with a different management of the control signals that feed the third level of the column decoder level. Changes to the architecture or in the number of column decoder selectors are not required.

To more particularly describe the features of the present invention, please refer to FIGS. 3 through 6 in conjunction with the discussion below.

Figure 3:
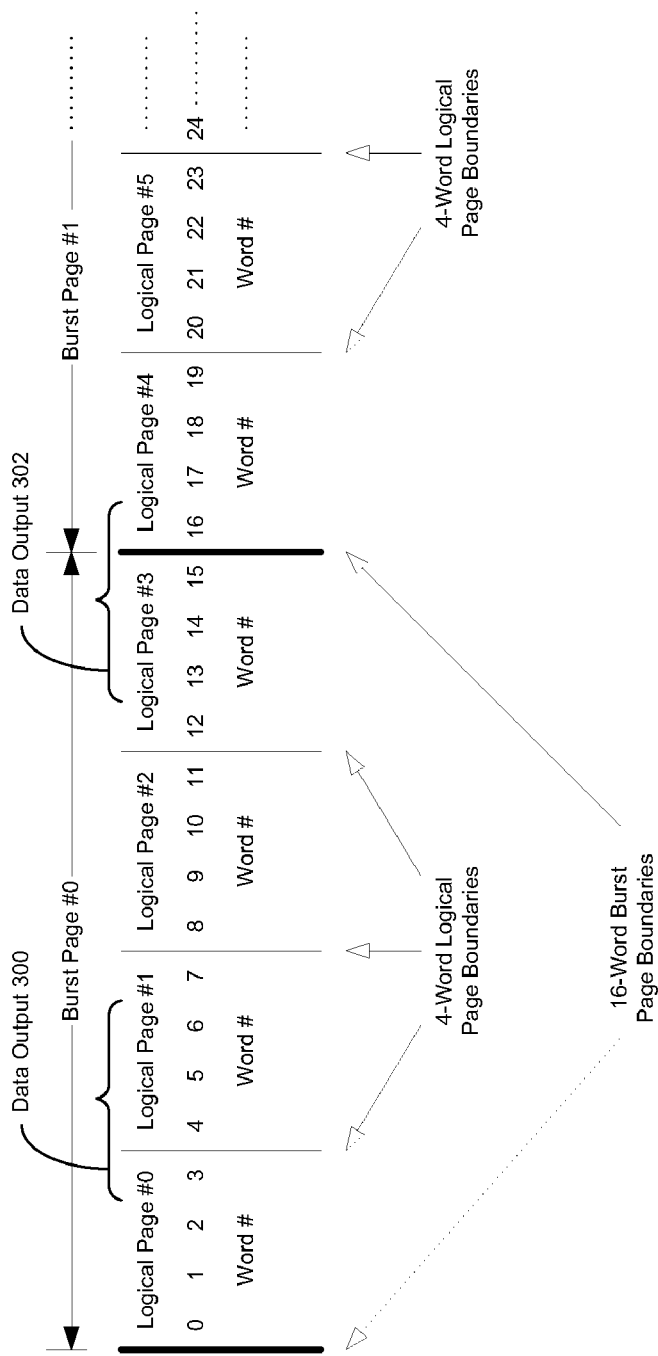
FIG. 3 illustrates a logical page and a burst page in accordance with the present invention.

FIG. 3 illustrates a logical page and a burst page in accordance with the present invention. In the illustrated example, the logical page has a length of four words, while the burst page has a length of 16 words. The minimum length of the burst page is determined by the specifications on the types of reads when the device is turned to synchronous mode.

Figure 4:
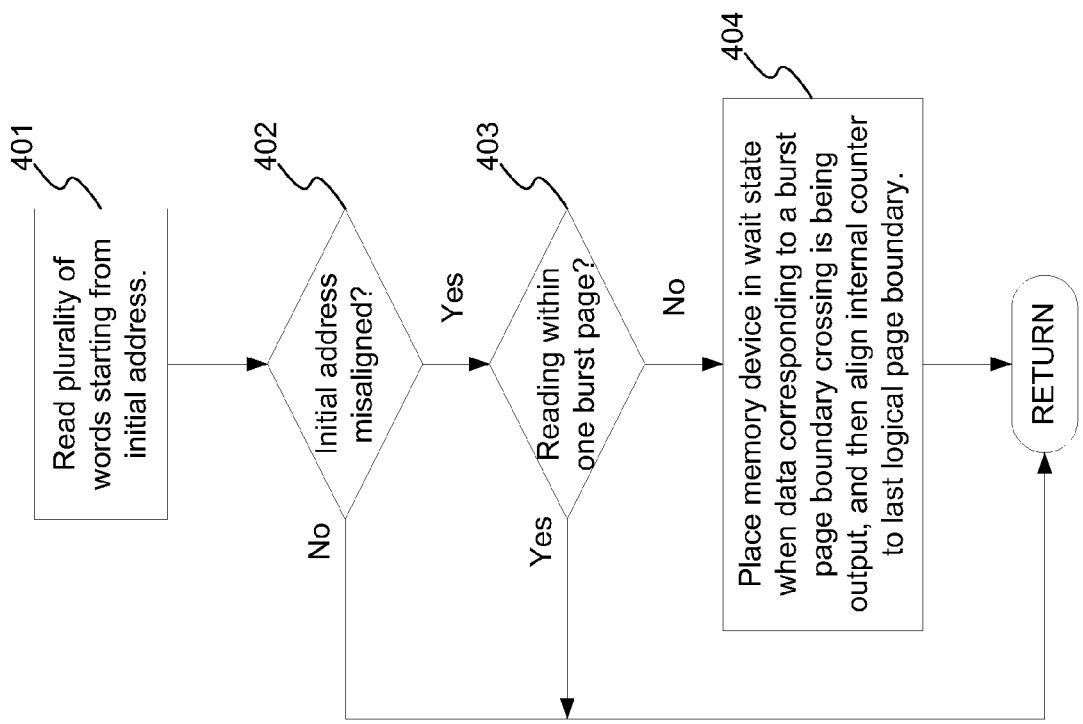
FIG. 4 is a flowchart illustrating a preferred embodiment of a method for synchronous read of a memory device in accordance with the present invention.

FIG. 4 is a flowchart illustrating a preferred embodiment of a method for synchronous read of a memory device in accordance with the present invention. First, a reading of a plurality of words is started from an initial address, via step 401. Next, it is determined if the initial address is misaligned, via step 402. Then, it is determined if the reading is within one burst page, via step 403, where the length of the burst page is greater than a length of the logical page. If the initial address is misaligned and the reading is not within one burst page, i.e., it crosses the burst page boundary, then the memory device is placed in a wait state when the data corresponding to the burst page boundary crossing is being output, and after this phase, an internal counter is aligned to the last logical page boundary, via step 404.

Figure 1:
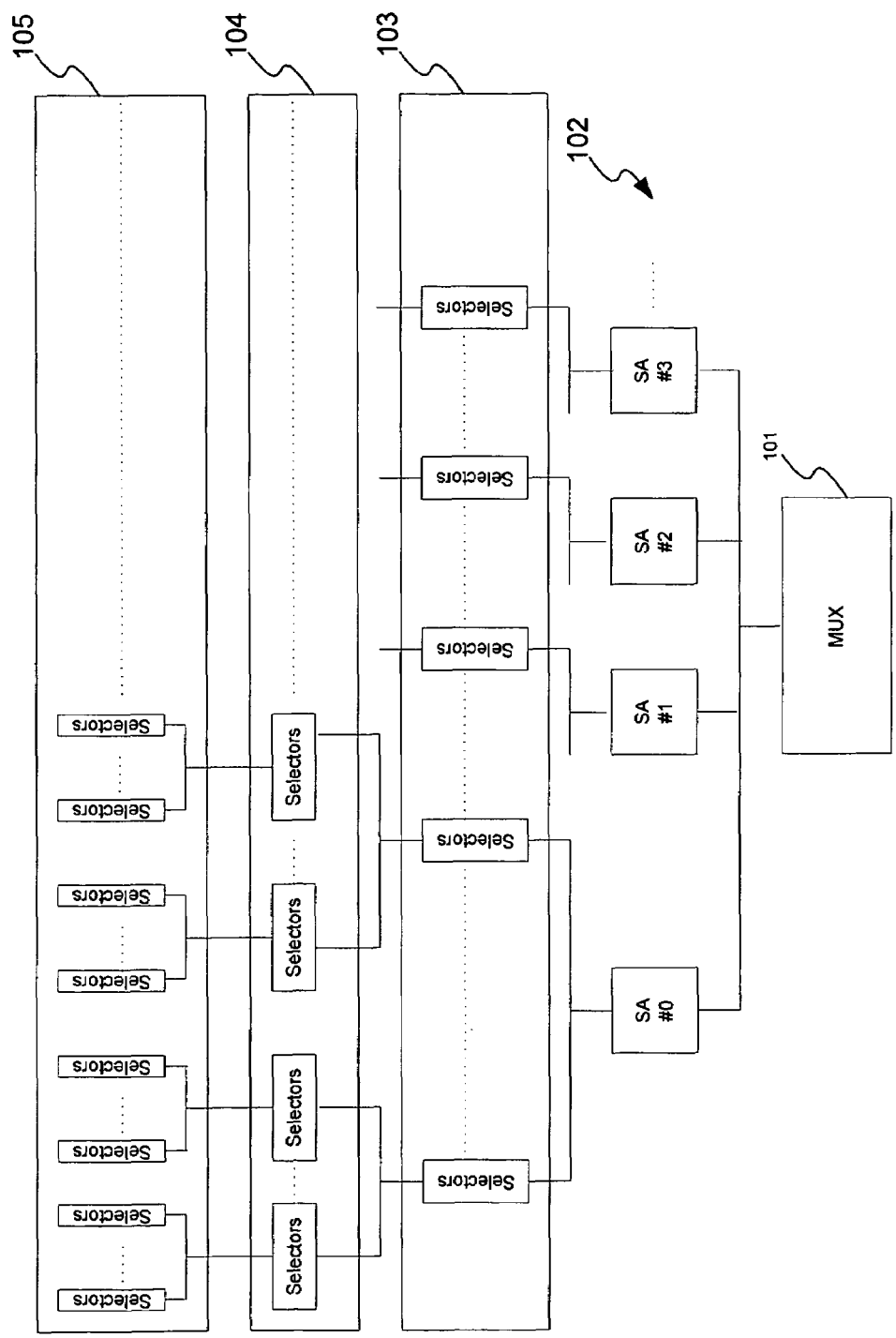
FIG. 1 illustrates a conventional column decoder for a single bit of a word.
Figure 2:
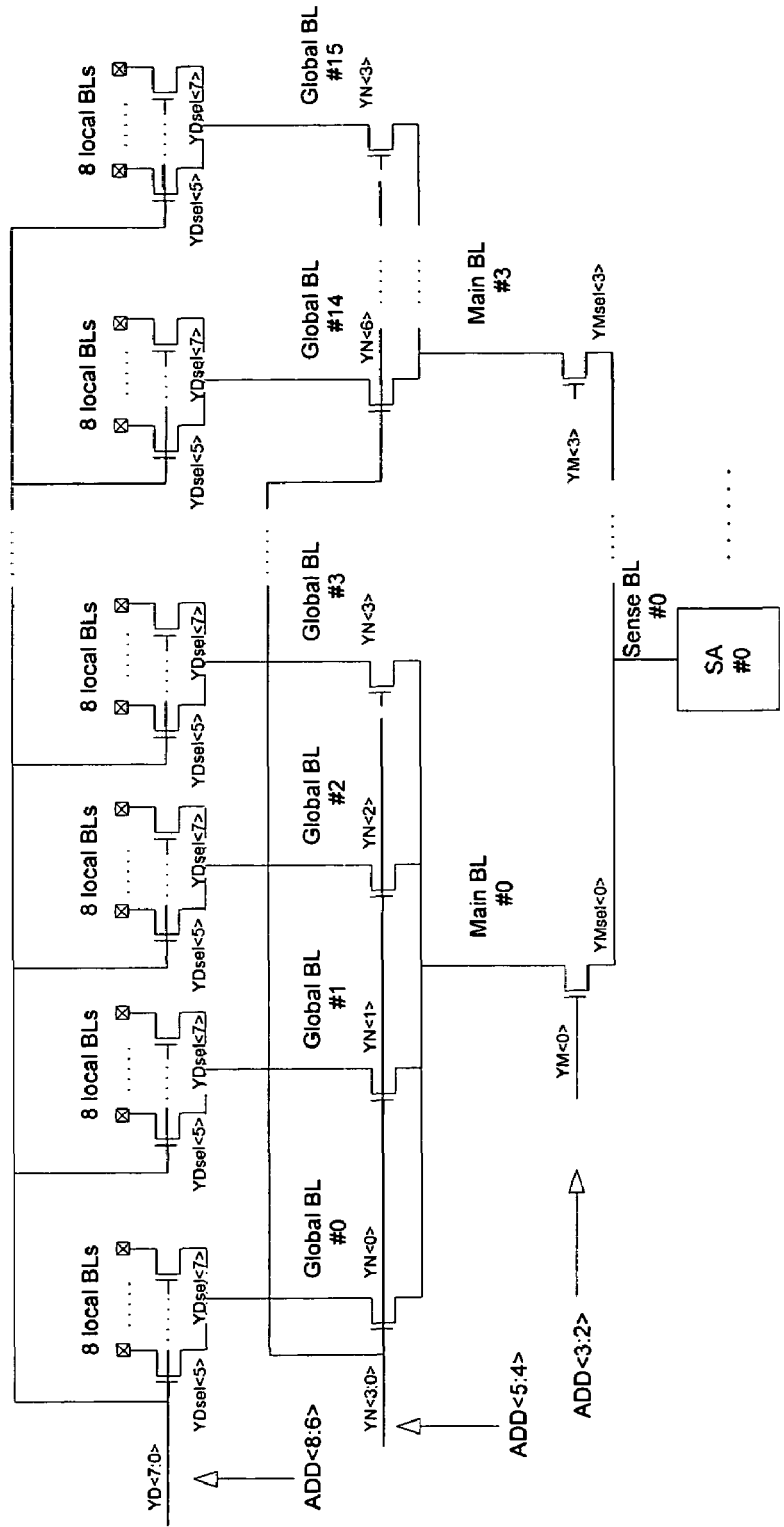
FIG. 2 illustrates a conventional implementation of a column decoder.
Figure 5:
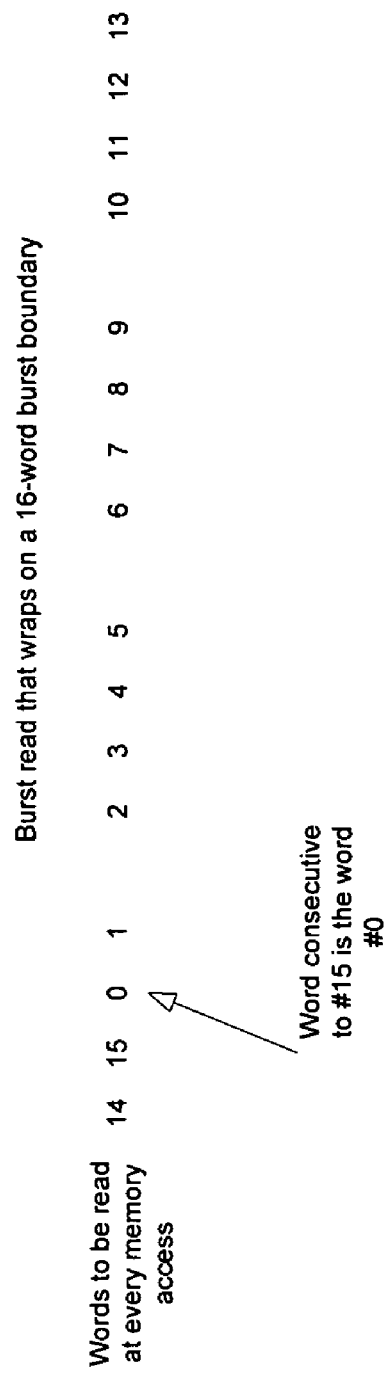
FIG. 5 illustrates an example wrap-read performed in accordance with the present invention.

For example, suppose that a wrap-read of fixed length of 16 words is to be performed without wait states. As illustrated in FIG. 5, for such a wrap-read, the column decoder in accordance with the present invention must be able to simultaneously read out groups of four consecutive words among the 16, even with a misalignment of the initial address. This means that a burst page of 16 words length is needed. If the architecture illustrated in FIG. 2 is used, in which sixteen YM signals are used instead of four, then the wrapped read could be managed. To properly generate the sixteen YM<15:0> signals in groups of four at every memory access, but in a way dependent on the type of read to be performed, a combination of ADD<3:0> instead of ADD<3:2> can be used. The four bits ADD<3:0> generates sixteen YM<15:0> signals. Now, the eventual wait states would occur only if the initial address is misaligned to a logical-page boundary of four words (as determined by ADD<1:0>), and the stream of words to be read crosses a burst-page boundary of sixteen words.

Figure 6:
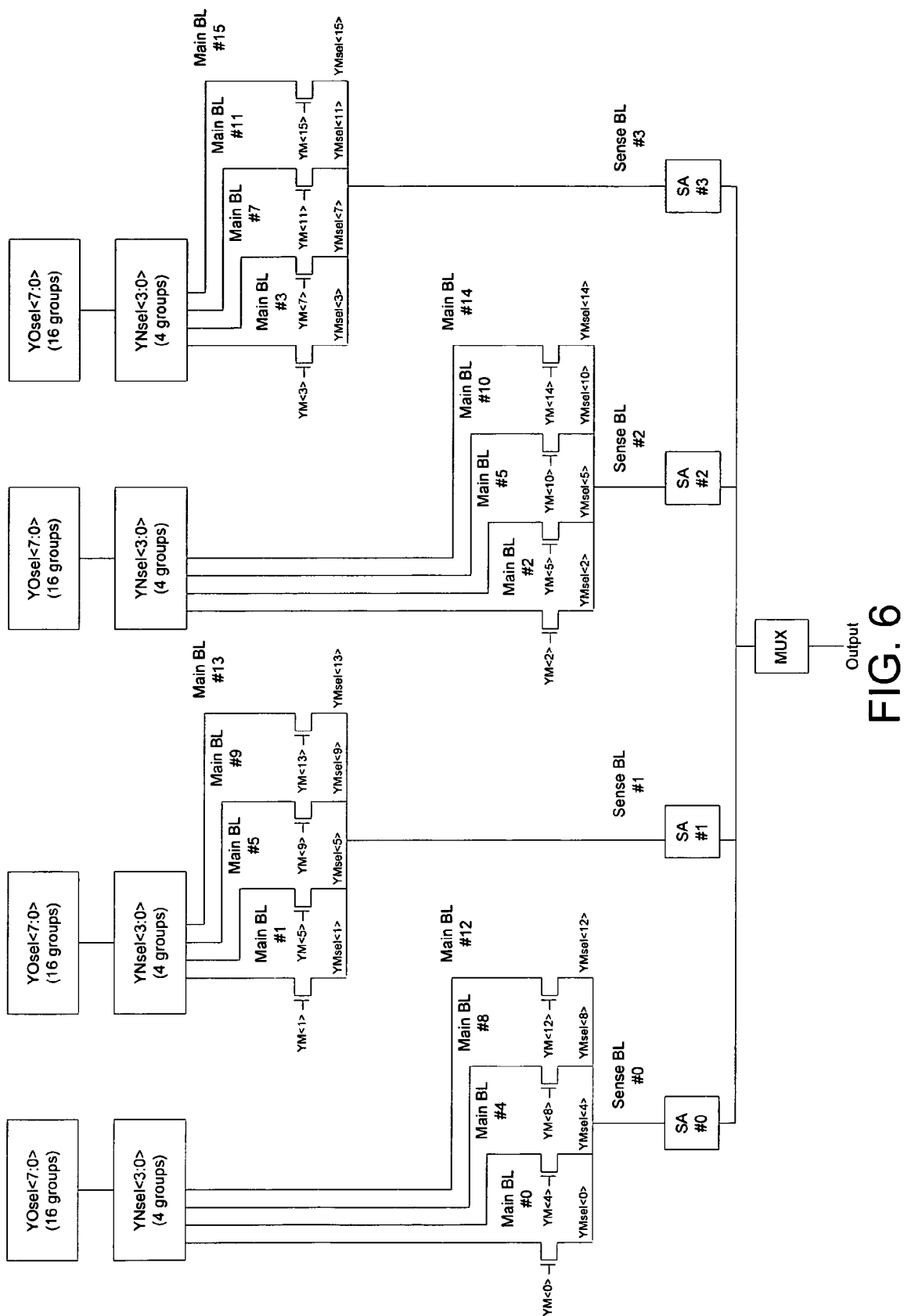
FIG. 6 illustrates a column decoder implementation in accordance with the present invention.

The number of eventual wait states depends on the amount of misalignment to the logical page boundary:

ADD<1:0>=<00>[0 bit misalignment]→no misalignment, no wait states
ADD<1:0>=<01>[1 bit misalignment]→1 wait state
ADD<1:0>=<10>[2 bit misalignment]→2 wait states
ADD<1:0>=<11>[3 bit misalignment]→3 wait states FIG. 6 illustrates a column decoder implementation in accordance with the present invention. This implementation is based on the architecture illustrated in FIG. 2, but with the YM signals managed to perform the synchronous reads across logical page boundaries within a burst page, as described above with FIGS. 3 through 5.

TABLE 1

|  | 1st read cycle | 2nd read cycle | 3rd read cycle | 4th read cycle | 5th read cycle |
|---|---|---|---|---|---|
| YM < 15:0) to be selected | 2-3-4-5 | 6-7-8-9 | 10-11-12-13 | 14-15-x-x | 0-1-2-3 |
| Read words | 2-3-4-5 | 6-7-8-9 | 10-11-12-13 | 14-15-inv-inv | 16-17-18-19 |
| Wait states | No-no-no-no | No-no-no-no | No-no-no-no | No-no-wait-wait | No-no-no-no |

As an example, Table 1 above illustrates the YM<15:0> logical values for five consecutive memory accesses, for a continuous length burst read, starting from a word addressed by ADD<3:0>=<0010>. YM at "x" values means that any YM selection would give invalid data, as shown by the correspondent read words, that are shielded by wait states. The fourth read cycle crosses the burst page boundary. From the fifth cycle onwards, the read page is aligned with a logical page. No more wait states will occur.

The architecture for the column decoder illustrated in FIG. 6 allows the four words to be read across two logical-pages, if these two logical pages belong to the same burst page. One burst page is made of four consecutive logical pages. The burst page boundary crossing occurs if two words, WA and WB, having |ADD<8:0>_WA-ADD<8:0>_WB|>16 must be read.

Providing the device with an appropriate control logic, once the first eventual burst page boundary has been crossed, causing eventual wait states in the case of an initial address misalignment, the device will align the internal counter to the last logical page boundary crossed, and no more wait states will occur.

If the minimum burst page length is a generic M, M being a multiple of 4, the illustrated solution can be easily extended. M selectors gated by M independent YM<M−1:0> signals are provided, and consequently have a total number of YD<i> and YN<i> signals equal to 32*(16/M), for an architecture that has 128 bits per output.

Thus, the burst page boundary M of 128 bits per output flash memory device can be selected in a wide range maintaining the total number of 128 selectors per output, by generating independent YM signals in a number equal to M.

For the column scrambling of FIGS. 6, where YM<i> selects the ith word within the burst page, when the device operates in asynchronous mode and logical page reads must be performed with a four-word logical page, YM<i>=YM<i+1>=YM<i+2>=YM<i+3>, for i=0, 4, 8, 12, depending on the values of bits ADD<3:2>:

ADD<3:2>=00→YM<0>, YM<1>, YM<2>, YM<3>selected
    ADD<3:2>=01→YM<4>, YM<5>, YM<6>, YM<7>selected
    ADD<3:2>=10→YM<8>, YM<9>, YM<10>, YM<11>selected
    ADD<3:2>=11→YM<12>, YM<13>, YM<14>, YM<15>selected An improved method and device for column decoding for flash memory devices has been disclosed. The present invention utilizes a burst page with a length greater than the length of a logical page. When a misalignment of an initial address occurs, valid reads across logical page boundaries are possible, unless a burst page boundary is crossed. The memory device thus enters the wait state only when a read with a misaligned initial address crosses a burst page boundary. This minimizes the amount of time in which the memory device enters the wait state. In the preferred embodiment, this is achieved with a different management of the control signals that feed the third level of a three-level decoding stage column decoder. Changes to the architecture or in the number of column decoder selectors are not required. The memory access time during synchronous reads is thus improved.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A column decoder for a memory device, comprising:
   a plurality of selector control signals, wherein each selector control signal is independently controlled such that a length of a burst page is greater than a length of a logical page; and
   a plurality of sense amplifiers coupled to the plurality of selector control signals for reading a plurality of words across a plurality of logical pages starting from an initial address,
   wherein the memory device is placed within a wait state when data corresponding to a burst page boundary crossing is being output, and an internal counter is aligned to a last logical page boundary, if the initial address is misaligned and the reading is not within one burst page.

2. The column decoder of claim 1, wherein a minimum length of the burst page is determined by specifications on types of reads when the memory device is turned to a synchronous mode.

3. The column decoder of claim 1, wherein if the initial address is misaligned and the reading is not within one burst page, the reading across the plurality of logical pages within the burst page are valid.

4. The column decoder of claim 1, wherein a third level of the column decoder comprises the plurality of selector control signals.

5. The column decoder of claim 1, further comprising:
   a selector multiplexer for actively choosing a word among a logical page to be read.

6. The column decoder of claim 1, wherein the length of a logical page is 4 words and the length of the burst page is 16 words, wherein 1 word consists of 32 bits.

7. The column decoder of claim 1, wherein the memory device is a flash memory device.

8. A column decoder for a memory device, the column decoder comprising:
   a plurality of selector control signals, wherein each selector control signal is independently controlled such that the column decoder is operable to simultaneously read a burst page from the memory device, the burst page having a length that is greater than a length of a logical page; and
   a plurality of sense amplifiers respectively coupled to the plurality of selector control signals for simultaneously reading a plurality of words from the memory device that spans across a plurality of logical page boundaries starting from an initial address,
   wherein the memory device does not have to enter a wait state during the reading out of the plurality of words when the initial address is misaligned with respect to a logical page boundary and the memory device is placed in a wait state only when the reading of plurality of words from the memory device crosses a burst page boundary.

9. The column decoder of claim 8, wherein a minimum length of the burst page is determined by specifications on types of reads when the memory device is turned to a synchronous mode in which the plurality of words are read sequentially from the memory device.

10. The column decoder of claim 8, wherein if the initial address is misaligned and the reading is not within one burst page, the reading across the plurality of logical pages within the burst page are valid.

11. The column decoder of claim 8, wherein the column decoder includes a first, second, and third level of decoding stages, and the third level of the column decoder comprises the plurality of selector control signals.

12. The column decoder of claim 8, further comprising:
    a selector multiplexer for actively choosing a word among the plurality of words read out from the memory device.

13. The column decoder of claim 8, wherein the length of a logical page is 4 words and the length of the burst page is 16 words, wherein 1 word consists of 32 bits.

14. The column decoder of claim 13, wherein the initial address is misaligned with respect to a logical page boundary when the initial address is not a multiple of 4.

15. The column decoder of claim 8, wherein the memory device is a flash memory device.

* * * * *

UNITED STATES PATENT AND TRADEMARK OFFICE
CERTIFICATE OF CORRECTION

PATENT NO.        : 7,333,389 B2
APPLICATION NO.   : 11/126441
DATED             : February 19, 2008
INVENTOR(S)       : Sivero et al.

It is certified that error appears in the above-identified patent and that said Letters Patent is hereby corrected as shown below:

In column 4, line 25, delete "15:0)" and insert -- 15:0> --, therefor.

Signed and Sealed this

Third Day of June, 2008

JON W. DUDAS
*Director of the United States Patent and Trademark Office*